(12) United States Patent
Kim et al.

(10) Patent No.: US 8,338,222 B2
(45) Date of Patent: Dec. 25, 2012

(54) METHOD OF FABRICATING ORGANIC LIGHT EMITTING DISPLAY

(75) Inventors: Mu-Hyun Kim, Suwon-si (KR);
Byung-Doo Chin, Suwon-si (KR);
Seong-Taek Lee, Suwon-si (KR)

(73) Assignee: Samsung Display Co., Ltd.,
Giheung-Gu, Yongin, Gyeonggi-Do (KR)

( * ) Notice: Subject to any disclaimer, the term of this patent is extended or adjusted under 35 U.S.C. 154(b) by 1565 days.

(21) Appl. No.: 11/018,577

(22) Filed: Dec. 22, 2004

(65) Prior Publication Data

US 2005/0196893 A1    Sep. 8, 2005

(30) Foreign Application Priority Data

Feb. 19, 2004  (KR) .................. 10-2004-0011155

(51) Int. Cl.
*H01L 51/40*    (2006.01)
(52) U.S. Cl. ............... 438/99; 438/28; 438/34; 438/35; 438/46; 438/47; 438/82; 257/40; 257/89; 257/90; 313/503; 313/504; 313/505; 313/506; 313/507
(58) Field of Classification Search ............ 438/28, 438/34, 35, 46, 47, 82, 99; 257/40, 89, 90; 313/503–507
See application file for complete search history.

(56) References Cited

U.S. PATENT DOCUMENTS

| | | | |
|---|---|---|---|
| 6,194,119 B1 * | 2/2001 | Wolk et al. | 430/200 |
| 2003/0044639 A1 * | 3/2003 | Fukuda | 428/690 |
| 2005/0173700 A1 * | 8/2005 | Liao et al. | 257/40 |

FOREIGN PATENT DOCUMENTS

CN    1457300    11/2003

(Continued)

OTHER PUBLICATIONS

Office action from the Japanese Patent Office issued in Applicant's corresponding Japanese Patent Application No. 2004-365074 dated Dec. 18, 2007.

(Continued)

*Primary Examiner* — Bac Au
(74) *Attorney, Agent, or Firm* — Robert E. Bushnell, Esq.

(57) ABSTRACT

A method of fabricating an organic light emitting display is capable of improving device characteristics by patterning a plurality of organic layers of an emission layer and a charge transport layer using a thermal transfer method to optimize thicknesses of the organic layers corresponding to R, G and B pixels. The method includes: forming lower electrodes of R, G and B pixels on a substrate; forming an organic layer on the layer; and forming an upper electrode on the organic layer. Formation of the organic layer includes forming a portion of a hole injection layer and a hole transport layer of the R, G and B pixels over an entire surface of the substrate, the organic layer comprising a first portion and a second portion, the organic layer having a thickness equal to a sum of the thicknesses of the hole injection layer and the hole transport layer. Formation of the organic layer further comprises patterning the second portion of the organic layer, and patterning emission layers of the R, G and B pixels. The second portion of the organic layer and the emission layers of the R, G and B pixels are simultaneously formed by a thermal transfer method using a thermal transfer device having the second portion of the organic layer and the emission layers of the R, G and B pixels as a transfer layer.

10 Claims, 9 Drawing Sheets

FOREIGN PATENT DOCUMENTS

| | | |
|---|---|---|
| JP | 06-275381 | 3/1994 |
| JP | 07-094278 | 4/1995 |
| JP | 2000-323277 | 11/2000 |
| JP | 2002-534782 | 10/2002 |
| JP | 2002-343564 | 11/2002 |
| JP | 2003-168559 | 6/2003 |
| WO | WO/00/41892 | 7/2000 |

OTHER PUBLICATIONS

Transmitter letter and Japanese Rejection Decision issued by Japanese Patent Office on Jun. 23, 2009 in the corresponding Japanese Patent Application No. 2004-365074.

* cited by examiner

METHOD OF FABRICATING ORGANIC LIGHT EMITTING DISPLAY

CLAIM OF PRIORITY

This application makes reference to, incorporates the same herein, and claims all benefits accruing under 35 U.S.C. §119 from an application for METHOD OF FABRICATING ORGANIC LIGHT EMITTING DISPLAY earlier filed in the Korean Intellectual Property Office on 19 Feb. 2004 and thereby duly assigned Serial No. 2004-11155.

BACKGROUND OF THE INVENTION

1. Field of the Invention

The present invention relates to a flat panel display and, more particularly, to a method of fabricating an organic light emitting display capable of improving device characteristics by patterning a plurality of organic layers using a thermal transfer method to optimize thicknesses of the organic layers corresponding to R, G and B pixels.

2. Description of the Related Art

Generally, an organic light emitting display (OLED) includes lower and upper electrodes formed on an insulating substrate, and a plurality of organic layers formed between the lower and upper electrodes. The organic layer is selected from a hole injection layer, a hole transport layer, an emission layer, a hole blocking layer, an electron transport layer and an electron injection layer depending upon functions of the respective layers. The display device has the upper and lower electrodes formed of a transparent electrode or a non-transparent electrode, so that the display device has such a structure that light is emitted from the organic layer toward the insulating substrate or in a direction opposite to the insulating direction, or is emitted both toward the insulating substrate and in a direction opposite to the insulating substrate.

When a full color OLED is manufactured by prior art techniques, optical thicknesses of the R, G and B pixels are different so that color coordinates and efficiency characteristics deteriorate.

SUMMARY OF THE INVENTION

The present invention solves the aforementioned problems by providing a method of fabricating a top emission OLED capable of improving color coordinates and efficiency characteristics by forming a plurality of organic layers using a thermal transfer method.

In an exemplary embodiment of the present invention, a method of fabricating an OLED includes: forming lower electrodes of R, G and B pixels on a substrate; forming an organic layer on the substrate; and forming an upper electrode on the organic layer. Formation of the organic layer includes forming a portion of the sum of thicknesses of a hole injection layer and a hole transport layer of the R, G and B pixels on an entire surface of the substrate, patterning the remaining portion of the sum of the thicknesses of the hole injection layer and the hole transport layer, and patterning emission layers of the R, G and B pixels. The remaining portion of the hole injection layer and the hole transport layer, and the emission layers of the R, G and B pixels, are simultaneously formed by a thermal transfer method using a thermal transfer device having the remaining portion of the hole injection layer and the hole transport layer, and the emission layers of the R, G and B pixels, as a transfer layer.

The organic layer can be an organic thin layer. The sum of the thicknesses of the hole injection layer and the hole transport layer of the R, G and B pixels, as a charge transport layer, is about 350 Å. The thicknesses of the emission layers of the R, G and B pixels is about 300~400 Å, 250~350 Å and 100~200 Å, respectively. The sum of the thicknesses of a hole blocking layer and an electron transport layer of the R, G and B pixels is about 300 Å. Finally, each of the thicknesses has a tolerance of about 50~200 Å.

The organic layer can be an organic layer. The sums of the thicknesses of the hole injection layer and the hole transport layer of the R, G and B pixels, as a charge transport layer, are about 2350 Å, 1700 Å, and 1350 Å, respectively. The thicknesses of the emission layers of the R, G and B pixels are about 300~400 Å, 250~350 Å, and 100~200 Å, respectively. The sum of thicknesses of a hole blocking layer and an electron transport layer of the R, G and B pixels is about 350 Å. Finally, each of the thicknesses has a tolerance of about 50~200 Å.

In another exemplary embodiment according to the present invention, a method of fabricating an OLED includes: forming lower electrodes of R, G and B pixels on a substrate; forming an organic layer on the substrate; and forming an upper electrode on the organic layer. Formation of the organic layer includes forming the hole injection layer of the R, G and B pixels over an entire surface of the substrate, forming a hole transport layer having the smallest thickness of hole transport layers of the R, G and B pixels over the entire surface of the substrate as a common layer, patterning hole transport layers of the remaining pixels, and patterning emission layers of the R, G and B pixels. The pixel having the smallest thickness of the hole transport layers of the R, G and B pixels allows only the emission layers to be patterned by a thermal transfer method using a thermal transfer device having the emission layer as a transfer layer, and the remaining pixels allow the hole transport layer and the emission layer to be simultaneously formed by the thermal transfer method using the thermal transfer device having the hole transport layer and the emission layer as a transfer layer, respectively.

The pixel including the hole transport layer having the smallest thickness of the R, G and B pixels is the B pixel; the sums of the thicknesses of the hole injection layer and the hole transport layer of the R, G and B pixels, as a charge transport layer, are about 2350 Å, 1700 Å, and 1350 Å, respectively. The thicknesses of the emission layers of the R, G and B pixels are about 300~400 Å, 250~350 Å, and 100~200 Å, respectively. The sum of the thicknesses of the hole blocking layer and the electron transport layer of the R, G and B pixels is about 350 Å. Finally, each thickness has a tolerance of about 50~200 Å.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate same or similar components, wherein.

DETAILED DESCRIPTION OF THE INVENTION

Hereinafter, embodiments of the present invention will be described with reference to the accompanying drawings.

Figure 1:
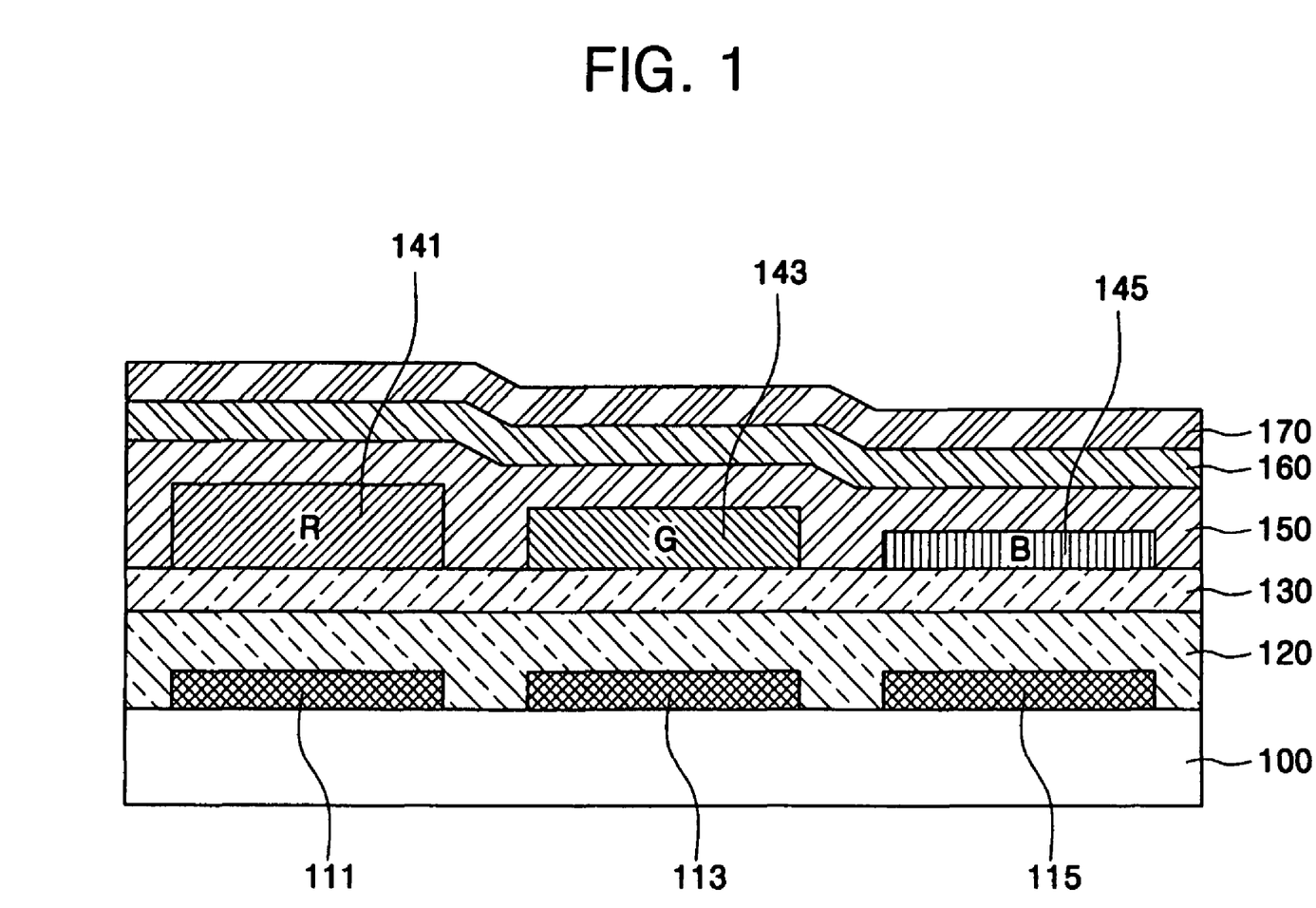
FIG. 1 is a cross-sectional view of a top emission OLED.

FIG. 1 is a cross-sectional view of a top emission OLED.

Referring to FIG. 1, anode electrodes 111, 113 and 115 of R, G and B pixels are separately formed on an insulating substrate 100, an organic layer or layers is or are formed over the insulating substrate 100, and a cathode electrode 170 is formed over the organic layer(s).

The organic layers, such as a hole injection layer 120 and a hole transport layer 130, are sequentially formed over an entire surface of the insulating substrate 100 having the anode electrodes 111, 113 and 115 of the R, G and B pixels formed thereon. Emission layers 141, 143 and 145 of the R, G and B pixels are formed in correspondence to the anode electrodes 111, 113 and 115 of the R, G and B pixels respectively, and a hole blocking layer 150 and an electron transport layer 160 are sequentially formed over an entire surface of the hole transport layer 130 so as to cover the emission layers 141, 143 and 145 of the R, G and B pixels.

The emission layers (EML) 141, 143 and 145 of the R, G and B pixels have a thickness appropriate to each of R, G and B colors, and are formed over the anode electrodes 111, 113 and 115, respectively, of the R, G and B pixels. A charge transport layer, such as the hole injection layer (HIL) 120 and the hole transport layer (HTL) 130, and a common layer such as the hole blocking layer (HBL) 150 and the electron transport layer (ETL) 160, are formed over the entire surface of the substrate 100.

The charge transport layer, such as the hole injection layer 120 and the hole transport layer 130, is formed over the entire surface of the substrate 100 using a deposition method, the emission layers 141, 143 and 145 of the R, G and B pixels are formed by the deposition method using shadow masks, and the common layer, such as the hole blocking layer 150 and the electron transport layer 160, is formed over the entire surface of the substrate 100 by the deposition method.

Figure 2:
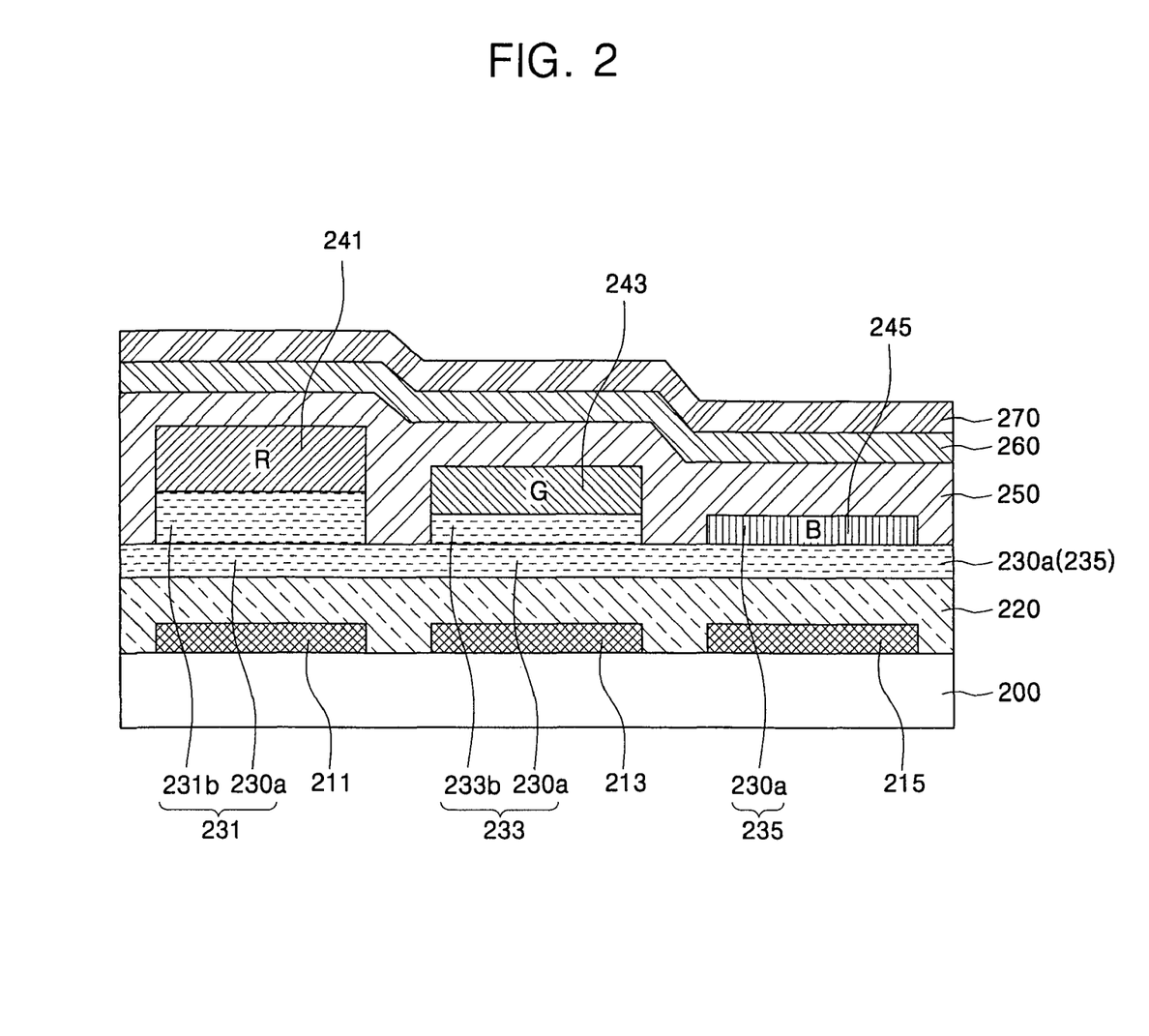
FIG. 2 is a cross-sectional view of an OLED in accordance with a first embodiment of the present invention.

FIG. 2 is a cross-sectional view of an OLED in accordance with a first embodiment of the present invention. The OLED includes an organic thin layer.

Referring to FIG. 2, anode electrodes 211, 213 and 215 of R, G and B pixels are separately formed on a substrate 200 as lower electrodes, an organic layer (described below) is formed over the substrate 200, and a cathode electrode 270 is formed on the organic layer as an upper electrode. The cathode electrode 270 comprises a transparent electrode or a semi-transparent electrode, and light emitted from the organic layer is emitted in a direction away from the substrate 200. The organic layer includes emission layers 241, 243 and 245 of the R, G and B pixels patterned in correspondence to the anode electrodes 211, 213 and 215 of the R, G and B pixels, respectively, and a charge transport layer (described below) formed on and under the emission layers 241, 243 and 245.

The charge transport layer includes a hole injection layer 220 and a hole transport layer 230 (231, 233, 235) formed between the anode electrodes 211, 213 and 215 of the R, G and B pixels and the emission layers 241, 243 and 245 of the R, G and B pixels. In addition, the charge transport layer includes a hole blocking layer 250 and an electron transport layer 260 formed between the R, G and B emission layers 241, 243 and 245 and the cathode electrode 270.

A portion of the charge transport layer formed between the anode electrodes 211, 213 and 215 of the R, G and B pixels and the emission layers 241, 243 and 245 of the R, G and B pixels is patterned in correspondence to the emission layers 241, 243 and 245 of the R, G and B pixels.

In accordance with a first embodiment of the present invention, of the hole transport layer 230 and the hole injection layer 220, only the hole transport layer 230 is patterned. The hole transport layer 230 comprises R, G and B hole transport layers 231, 233 and 235, respectively, which includes a common layer 230a formed over an entire surface of the substrate 200, and patterning layers 231b and 233b formed in correspondence to the R and G emission layers 241 and 243, respectively. The common layer 230a is formed over the entire surface of the substrate 200, and one of the hole transport layers 231, 233 and 235 of the R, G and B pixels has the smallest thickness. For example, the common layer 230a is formed by a deposition method so that the hole transport layer 235 of the B pixel has the smallest thickness relative to the hole transport layers of the R and G pixels 231 and 233, respectively.

Subsequently, the patterning layers 231b, 233b of the hole transport layers 231, 233, 235 and the emission layers 241, 243, 245 are formed in correspondence to the anode electrodes 211, 213 and 215 of the R, G and B pixels by simultaneously patterning the patterning layers 231b, 233b of the hole transport layer 230 and the emission layers 241, 243, 245 using the thermal transfer method. A method of simultaneously patterning the hole transport layer 230 and the emission layers 241, 243, 245 using the thermal transfer method will be described with reference to FIGS. 3A and 3B, and Table 1.

TABLE 1

| | Sum of thicknesses of HIL and HTL | Thickness of EML | Sum of thicknesses of HBL and ETL |
|---|---|---|---|
| R | 2350 Å | 300~400 Å | 350 Å |
| G | 1700 Å | 250~350 Å | 350 Å |
| B | 1350 Å | 100~200 Å | 350 Å |

Table 1 represents optically optimized thicknesses corresponding to the R, G and B pixels, when the cathode electrode 270 employs indium tin oxide (ITO) having a thickness of about 125 Å and the organic layer is formed in a thick layer. In this regard, the thickness of each layer has a tolerance of about 50~200 Å.

Figure 3A:
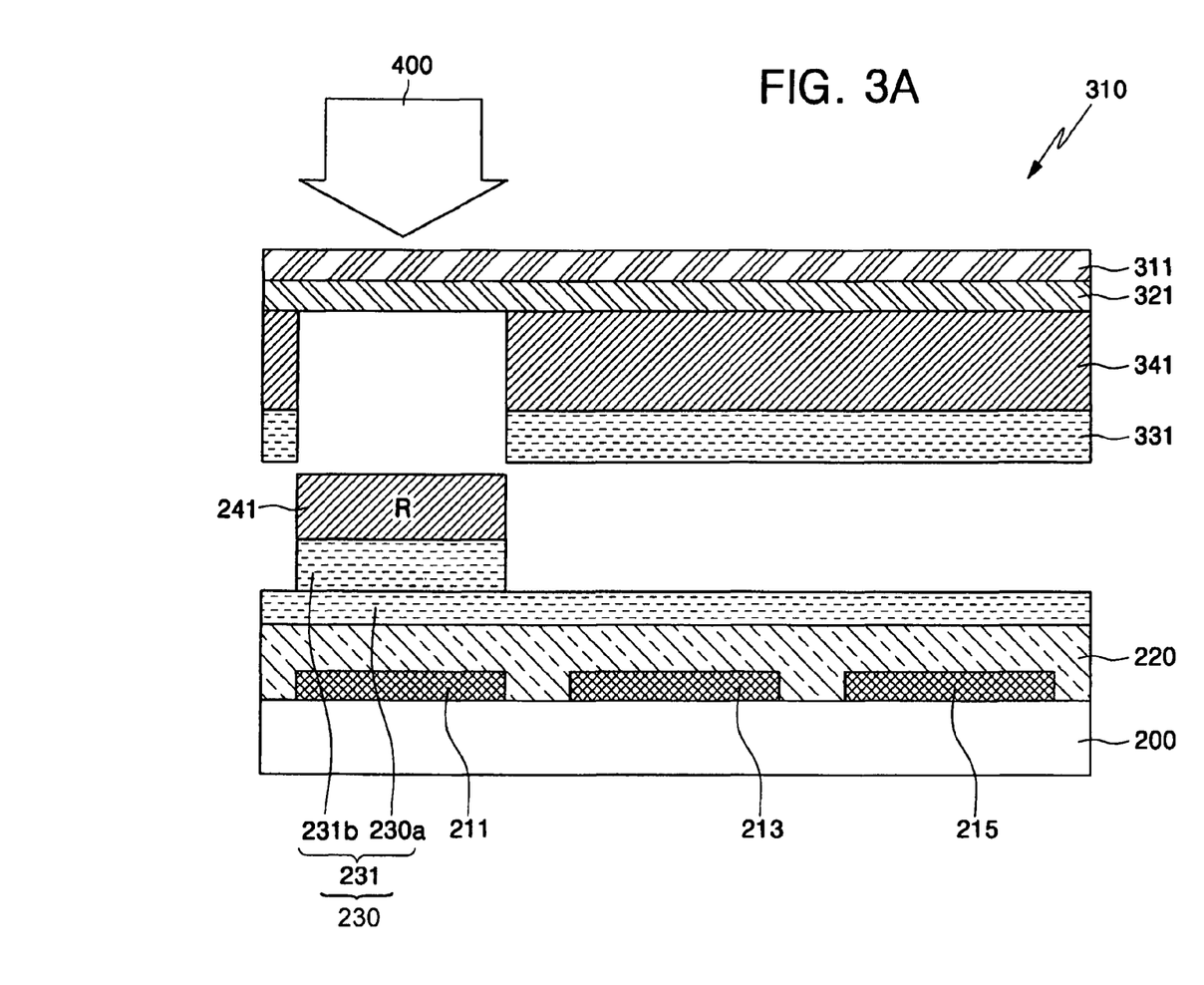
FIGS. 3A and 3B are cross-sectional views of processes illustrating a method of fabricating an OLED using a thermal transfer method in accordance with the first embodiment of the present invention.

First, referring to FIG. 3A, the hole injection layer 220 is formed by a deposition method over the entire surface of the substrate 200, on which the anode electrodes 211, 213 and 215 of the R, G and B pixels are formed, and a portion of the hole transport layer 230 (i.e., the common layer 230a of the hole transport layer 230) is formed on the entire surface of the hole injection layer 220 by a deposition method similar to that used to form the hole injection layer 220. The deposition thickness of the common layer 230a of the hole transport layer 230 and the deposition thickness of the hole injection layer 220 are determined in dependence upon the pixel having the smallest sum of the thicknesses of the hole transport layer 230 and the hole injection layer 220 of the R, G and B pixels. Therefore, the common layer 230a of the hole transport layer 230 and the hole injection layer 220 are deposited to a thickness of about 1350 Å, which is equal to the sum of the thicknesses of the hole transport layer 231 and the hole injection layer 220 of the B pixel, as shown in Table 1.

Next, a thermal transfer device 310 for patterning the patterning layer 231b of the R hole transport layer 231 and the R emission layer 241 is prepared. The thermal transfer device 310 includes a base substrate 311, a light to heat conversion layer 321 formed on the base substrate 311, an organic layer 331 for the R hole transport layer 231 as a transfer layer, and an organic layer 341 for the R emission layer 241.

Referring to FIG. 3A, a laser 400 is irradiated onto the thermal transfer device 310, simultaneously patterning the organic layers 331 and 341 to form the patterning layer 231b and the emission layer 241. As a result, the patterning layer 231b of the R hole transport layer 231 and the R emission layer 241 are formed on the common layer 230a of the R hole transport layer 231 above the R anode electrode 211.

Figure 3B:
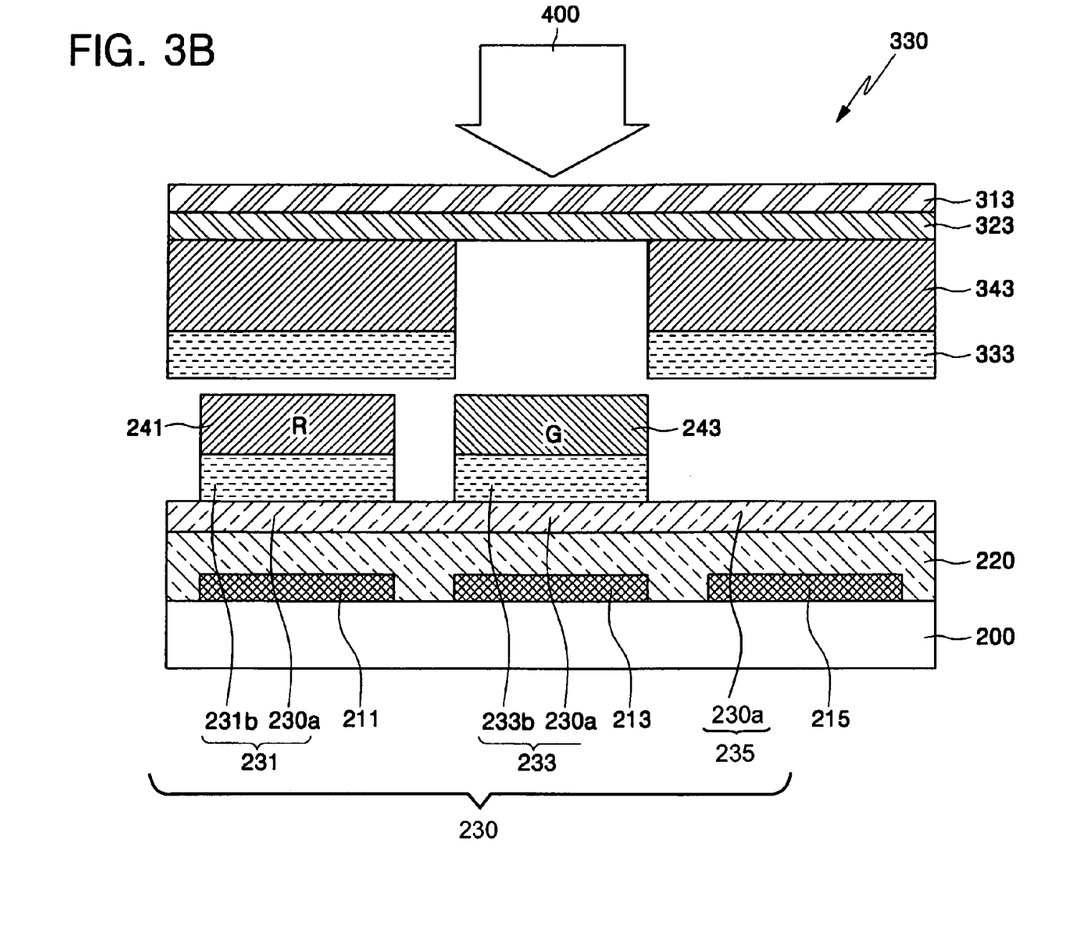

Referring to FIG. 3B, in the first embodiment of the present invention, the hole transport layer 230 includes the common layer 230a formed over the entire surface of the substrate 200, and the patterning layers 231b and 233b formed in correspondence to the emission layers 241 and 243 of the R and G pixels, respectively. The R pixel includes the R hole transport layer 231 having the common layer 230a and the patterning layer 231b, the G pixel includes the G hole transport layer 233 having the common layer 230a and the patterning layer 233b, and the B pixel includes the B hole transport layer 235 having only the common layer 230a. At this point, since the sums of the thicknesses of the hole transport layer 230 and the hole injection layer 220 corresponding to the R, G and B pixels are different from each other as shown in Table 1, the thicknesses of the patterning layers 231b and 233b of the hole transport layers 231 and 233 of the R and G pixels, respectively, are different from each other.

Next, a thermal transfer device 330 for patterning the patterning layer 233b of the G hole transport layer 233 and the G emission layer 243 is prepared. The thermal transfer device 330 includes a base substrate 313, a light to heat conversion layer 323 formed on the base substrate 313, an organic layer 333 for the G hole transport layer 233 as a transfer layer, and an organic layer 343 for the G emission layer 243.

A laser 400 is irradiated onto the thermal transfer device 330, simultaneously patterning the organic layers 333 and 343 so as to form the patterning layer and the emission layer, that is, so as to form the patterning layer 233b of the G hole transport layer 233 and the G emission layer 243 on the common layer 230a of the hole transport layer 230 above the G anode electrode 213. Finally, a laser is irradiated onto a thermal transfer device (not shown) for the B emission layer 245 (FIG. 2), simultaneously patterning the thermal transfer device. Therefore, the B emission layer 245 is formed on the common layer 230a above the anode electrode 215 of the B pixel. At this point, in the case of the B pixel, since the B hole transport layer 235 is already formed as the common layer 230a, the thermal transfer device for the B pixel includes only the organic layer for the B emission layer 245, except for the organic layer for the B hole transport layer 235.

Figure 4:
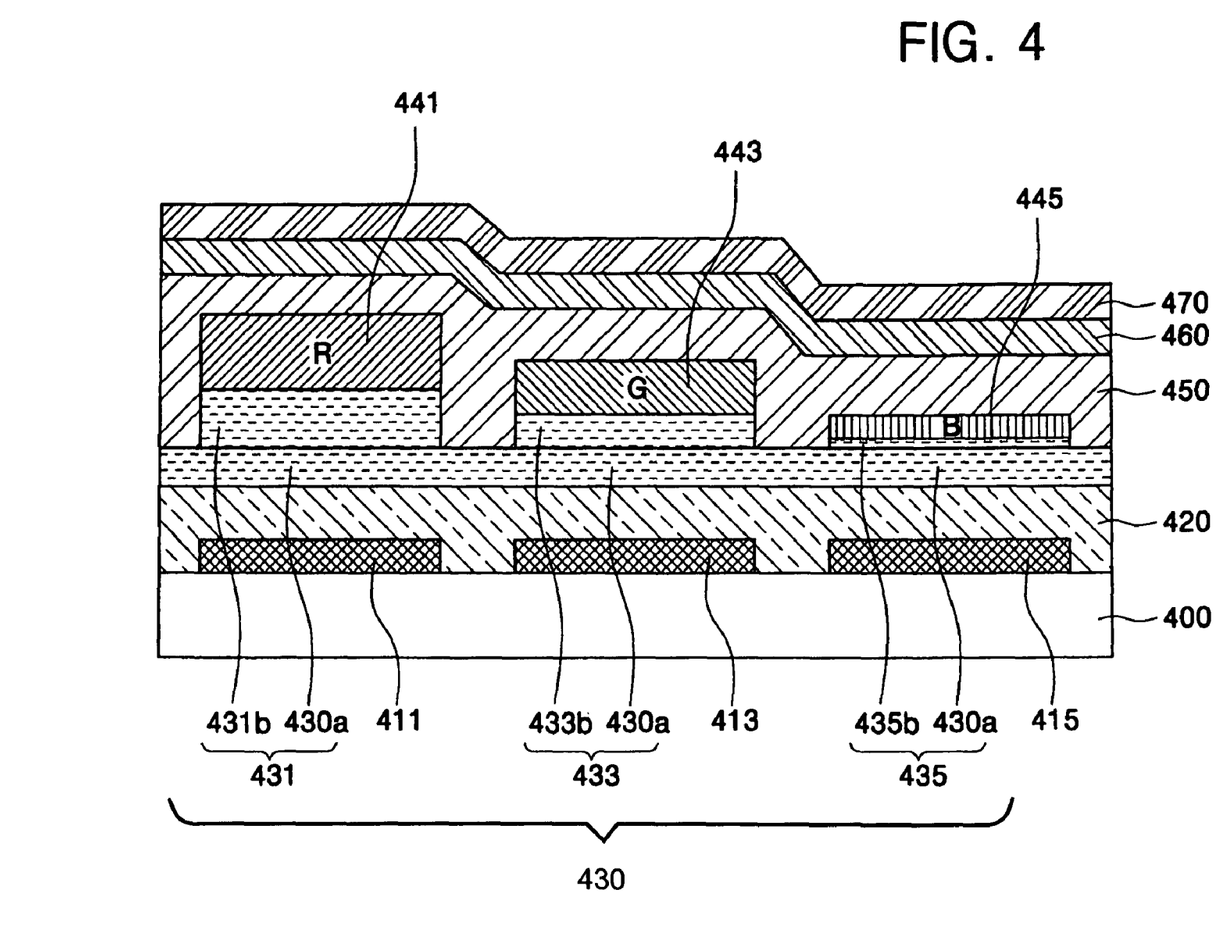
FIG. 4 is a cross-sectional view of an OLED in accordance with a second embodiment of the present invention.

FIG. 4 is a cross-sectional view of an OLED in accordance with a second embodiment of the present invention.

Referring to FIG. 4, anode electrodes 411, 413 and 415 of R, G and B pixels are separately formed on a substrate 400 as lower electrodes, an organic layer (described below) is formed over the substrate 400, and a cathode electrode 470 is formed on the organic layer as an upper electrode. The cathode electrode 470 comprises a transparent electrode or a semi-transparent electrode, and light emitted from the organic layer is emitted in a direction away from the substrate 400. The organic layer includes emission layers 441, 443 and 445 of the R, G and B pixels patterned in correspondence to the anode electrodes 411, 413 and 415 of the R, G and B pixels, and a charge transport layer formed on and under the emission layers 441, 443 and 445.

The charge transport layer includes a hole injection layer 420 and a hole transport layer 430 formed between the anode electrodes 411, 413 and 415 of the R, G and B pixels and the emission layers 441, 443 and 445 of the R, G and B pixels. In addition, the charge transport layer includes a hole blocking layer 450 and an electron transport layer 460 formed between the R, G and B emission layers 441, 443 and 445 and the cathode electrode 470.

A portion of the charge transport layer formed between the anode electrodes 411, 413 and 415, (i.e., the lower electrodes, of the R, G and B pixels) and the emission layers 441, 443 and 445 of the R, G and B pixels is patterned in correspondence to the emission layers 441, 443 and 445 of the R, G and B pixels.

In the second embodiment of the present invention, of the hole injection layer 420 and the hole transport layer 430, only the hole transport layer 430 is patterned in correspondence to the R, G and B pixels to a predetermined thickness. The hole transport layer 430 may be entirely patterned in correspondence to the R, G and B pixels, or both of the hole injection layer 420 and the hole transport layer 430 may be entirely patterned in correspondence to the R, G and B pixels, or a portion of the hole injection layer 420 may be patterned in correspondence to the R, G and B pixels and the hole transport layer 430 may be entirely patterned in correspondence to the R, G and B pixels. FIG. 4 illustrates a method of patterning only a portion of the hole transport layer 430 in correspondence to the R, G and B pixels.

The hole transport layer 430 includes a common layer 430a formed over the entire surface of the substrate 400, and patterning layers 431b, 433b and 435b formed in correspondence to the R, G and B emission layers 441, 443 and 445, respectively. The R pixel includes the R hole transport layer 431 having the common layer 430a and the patterning layer 431b, the G pixel includes the G hole transport layer 433 having the common layer 430a and the patterning layer 433b, and the B pixel includes the B hole transport layer 435 having the common layer 430a and the patterning layer 435b.

The sum of the thicknesses of the hole transport layer 430 and the hole injection layer 420 of the R, G and B pixels becomes the sum of the thicknesses of the hole injection layer 420, and the common layer 430a and the R, G and B patterning layers 431b, 433b and 435b of the hole transport layer 430. In addition, the patterning layers 431b, 433b and 435b of the R, G and B pixels have different values from each other. At this point, where the sum of the thicknesses of the hole injection layer 420 and the hole transport layer 430 of the R, G and B pixels are yr, yg, and yb, respectively, and where the sum of the thicknesses of the common layer 430a of the hole transport layer 430 and the hole injection layer 420 is x, the thicknesses xr, xg and xb of the patterning layers 431b, 433b and 435b of the hole transport layer 430 of the R, G and B pixels become yr-x, yg-x and yb-x, respectively. For example, where x is 1300 Å, since yr, yg and yb are 2350 Å, 1700 Å and 1350 Å, respectively, from Table 1, xr, xg and xb become 1350 Å, 400 Å and 50 Å, respectively.

Therefore, in the second embodiment of the present invention, the thicknesses of patterned portions of the hole injection layer 420 and the hole transport layer 430 are determined by the smallest sum of the thicknesses of the hole injection layer 420 and the hole transport layer 430 among the R, G and B pixels, and the thicknesses of the patterned portions of the hole injection layer 420 and the hole transport layer 430 are determined by the sum of the thicknesses of the hole injection layer 420 and the hole transport layer 433 of the B pixel. That is, the thicknesses of the patterned portions of the hole injection layer 420 and the hole transport layer 430 are greater than zero, and equal to or smaller than the thickness of the hole injection layer 420 and the hole transport layer 430. In this connection, the thickness of the patterned portion being greater than zero means that at least a portion of the hole transport layer 430 and the hole injection layer 420 was patterned, and the thickness of the patterned portion being equal to the thicknesses of the hole injection layer 420 and the hole transport layer 430 means that the hole injection layer 420 and the hole transport layer 430 were entirely patterned.

The process of forming the organic layer is performed by the same method as in the first embodiment shown in FIGS. 3A and 3B, except that the thermal transfer device for patterning the hole transport layer 435 and the emission layer 445 of the B pixel additionally includes both of the organic layers for patterning the hole transport layer 435 and the emission layer 445.

Figure 5:
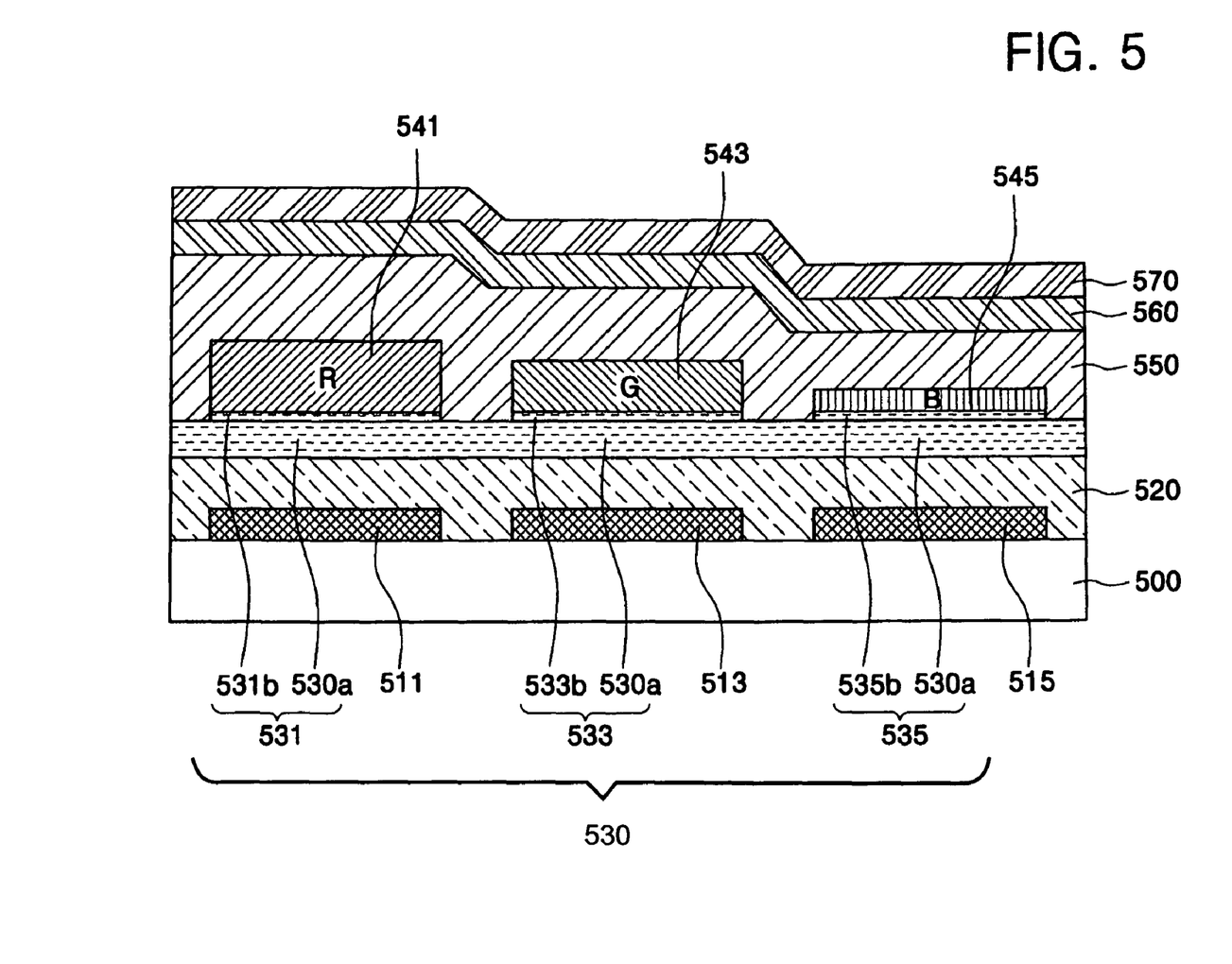
FIG. 5 is a cross-sectional view of an OLED in accordance with a third embodiment of the present invention.

FIG. 5 is a cross-sectional view of an OLED in accordance with a third embodiment of the present invention, which includes an organic thin layer.

Referring to FIG. 5, anode electrodes 511, 513 and 515 of R, G and B pixels are separately formed on a substrate 500 as lower electrodes, an organic layer is formed over the substrate 500, and a cathode electrode 570 is formed on the organic layer as an upper electrode. The cathode electrode 570 as the upper electrode comprises a transparent electrode or a semitransparent electrode, and light emitted from the organic layer is emitted in a direction away from the substrate 500. The organic layer includes emission layers 541, 543 and 545 of the R, G and B pixels patterned in correspondence to the anode electrodes 511, 513 and 515 of the R, G and B pixels, and a charge transport layer formed on and under the emission layers 541, 543 and 545.

The charge transport layer includes a hole injection layer 520 and a hole transport layer 530 formed between the anode electrodes 511, 513 and 515 of the R, G and B pixels and the emission layers 541, 543 and 545 of the R, G and B pixels. In addition, the charge transport layer includes a hole blocking layer 550 and an electron transport layer 560 formed between the R, G and B emission layers 541, 543 and 545 and the cathode electrode 570.

A portion of the charge transport layer formed between the anode electrodes 511, 513 and 515 (i.e., the lower electrodes, of the R, G and B pixels) and the emission layers 541, 543 and 545 of the R, G and B pixels is patterned in correspondence to the emission layers 541, 543 and 545 of the R, G and B pixels.

In a third embodiment of the present invention, of the hole injection layer 520 and the hole transport layer 530, only the hole transport layer 530 is patterned in correspondence to the R, G and B pixels to a uniform thickness. The hole transport layer 530 may be entirely patterned in correspondence to the R, G and B pixels, or both the hole injection layer 520 and the hole transport layer 530 may be entirely patterned in correspondence to the R, G and B pixels, or a portion of the hole injection layer 520 may be patterned in correspondence to the R, G and B pixels and the hole transport layer 530 may be entirely patterned in correspondence to the R, G and B pixels. FIG. 5 illustrates a method of patterning only a portion of the hole transport layer 530 in correspondence to the R, G and B pixels.

The hole transport layer 530 includes a common layer 530a formed over the entire surface of the substrate 500, and patterning layers 531b, 533b and 535b formed in correspondence to the R, G and B emission layers 541, 543 and 545, respectively. The R pixel includes R hole transport layer 531 having the common layer 530a and the patterning layer 531b, the G pixel includes G hole transport layer 533 having the common layer 530a and the patterning layer 533b, and the B pixel includes B hole transport layer 535 having the common layer 530a and the patterning layer 535b.

Therefore, the sum of the thicknesses of the hole transport layer 530 and the hole injection layer 520 of the R, G and B pixels becomes the sum of the thicknesses of the hole injection layer 520, and the common layer 530a and the R, G and B patterning layers 531b, 533b and 535b of the hole transport layer 530. In the third embodiment using an organic thin layer, in contrast to the second embodiment, since the thicknesses of the hole transport layer 530 and the hole injection layer 520 of the R, G and B pixels are equal as shown in Table 2, the thicknesses of the patterning layers 531b, 533b and 535b have the same value. At this point, where the sum of the thicknesses of the hole injection layer 520 and the hole transport layer 530 of the R, G and B pixels is y, and where the sum of the thicknesses of the common layer 530a of the hole transport layer 530 and the hole injection layer 520 is x, the thicknesses xr, xg and xb of the patterning layers 531b, 533b and 535b of the hole transport layer 530 of the R, G and B pixels become y-x equally. For example, where x is 100 Å, since y is 350 Å from Table 2, xr, xg and xb become 250 Å equally.

Therefore, in the third embodiment of the present invention, since the thicknesses of patterned portions of the hole injection layer 520 and the hole transport layer 530 are determined by the sum of the thicknesses of the hole injection layer 520 and the hole transport layer 530, the thicknesses of the patterned portions of the hole injection layer 520 and the hole transport layer 530 are greater than zero, and equal to or smaller than the thicknesses of the hole injection layer and the hole transport layer 530.

In this connection, the thickness of the patterned portion being greater than zero means that at least a portion of the hole transport layer 530 and the hole injection layer 520 is patterned, and the thickness of the patterned portion being equal to the thicknesses of the hole injection layer 520 and the hole transport layer 530 means that the hole injection layer 520 and the hole transport layer 530 are entirely patterned.

A process of forming the organic layer through a method of simultaneously patterning the hole transport layer 530 and the emission layers 541, 543, 545 using a thermal transfer method will be described with reference to FIGS. 6A to 6C, and Table 2.

TABLE 2

|   | Sum of thicknesses of HIL and HTL | Thickness of EML | Sum of thicknesses of HBL and ETL |
|---|---|---|---|
| R | 350 Å | 300~400 Å | 300 Å |
| G | 350 Å | 250~350 Å | 300 Å |
| B | 350 Å | 100~200 Å | 300 Å |

Table 2 represents optically optimized thicknesses corresponding to the R, G and B pixels, when the cathode electrode 570 comprises ITO having a thickness of about 125 Å and the organic layer is formed of a thin layer. At this point, the thickness of each layer has a tolerance of about 50~200 Å.

Figure 6A:
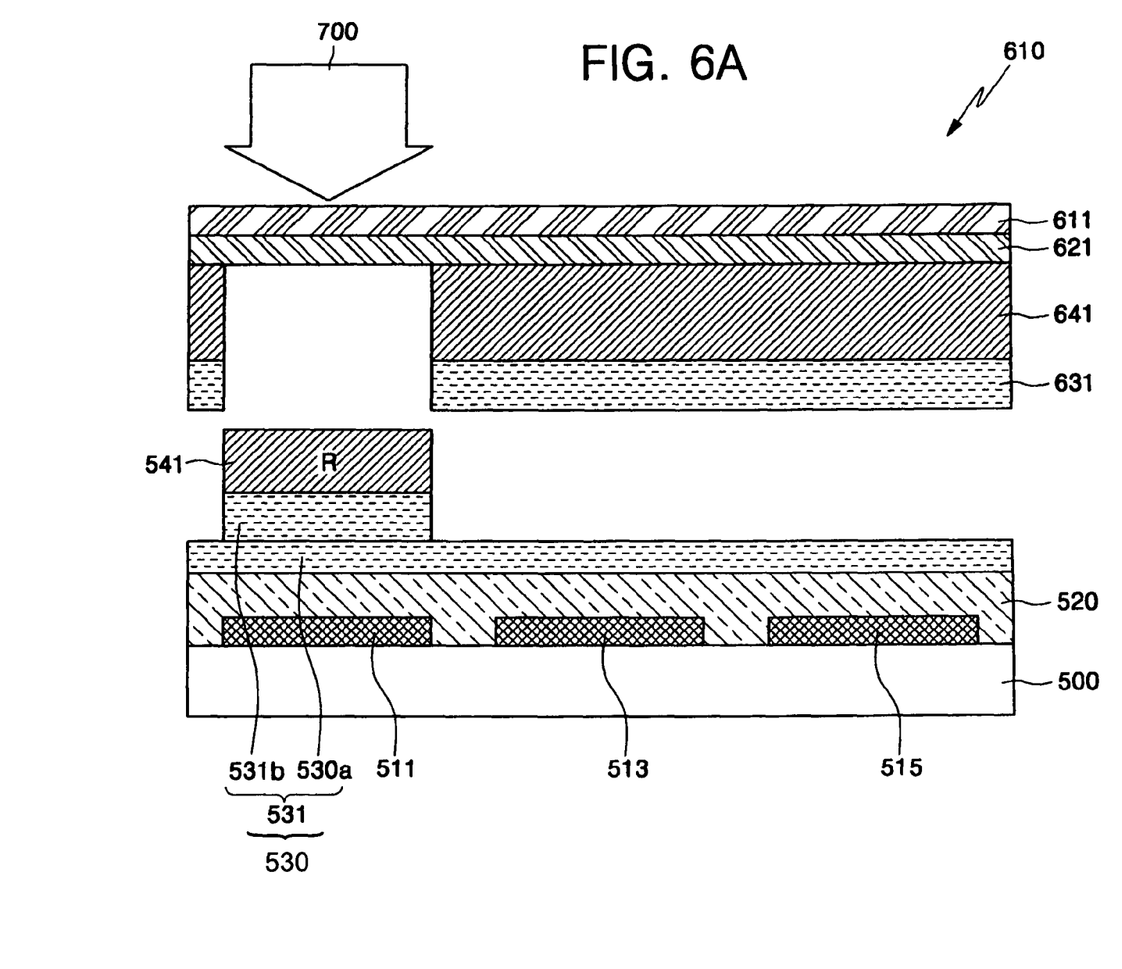
FIGS. 6A to 6C are cross-sectional views of processes illustrating a method of fabricating an OLED using a thermal transfer method in accordance with the third embodiment of the present invention.

First, referring to FIG. 6A, a hole injection layer 520 is formed on the entire surface of a substrate 500, at which anode electrodes 511, 513 and 515 of the R, G and B pixels are formed, by a deposition method, and a portion of the hole transport layer 530 (i.e., a common layer 530a of the hole transport layer 530) is formed on the entire surface of the hole injection layer 520 by a deposition method similar to that used to form the hole injection layer 520.

Next, a thermal transfer device 610 for patterning a patterning layer 531b of the R hole transport layer 531 and an R emission layer 541 is prepared. The thermal transfer device 610 includes a base substrate 611, a light conversion layer 621 formed on the base substrate 611, an organic layer 631 for the R hole transport layer 531 as a transfer layer, and an organic layer 641 for the R emission layer.

A laser 700 is irradiated onto the thermal transfer device 610, simultaneously patterning the organic layers 631 and 641 so as to form the patterning layer 531b and the emission layer 541. As a result, the patterning layer 531b of the R hole transport layer 531 and the R emission layer 541 are formed on the common layer 530a of the hole transport layer 530 above the R anode electrode 511.

Figure 6B:
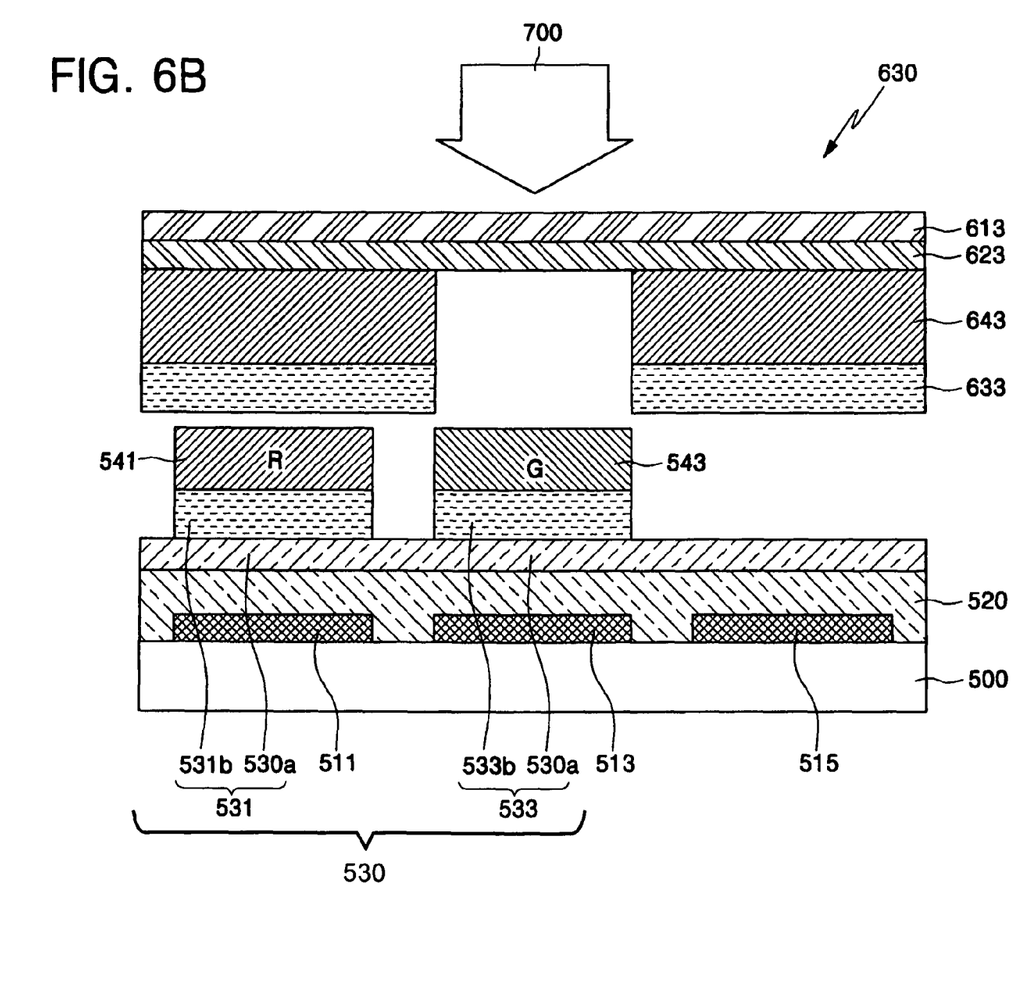

Next, as shown in FIG. 6B, a thermal transfer device 630 for patterning a patterning layer 533b of the G hole transport layer 533 and a G emission layer 543 is prepared. The thermal transfer device 630 includes a base substrate 613, a light to heat conversion layer 623 formed on the base substrate 613, an organic layer 633 for the G hole transport layer 533 as a transfer layer, and an organic layer 643 for the G emission layer 543.

A laser 700 is irradiated onto the thermal transfer device 630, simultaneously patterning the organic layers 633 and 643 so as to form the patterning layer 533b and the emission layer 543. As a result, the patterning layer 533b of the G hole transport layer 533 and the G emission layer 543 are formed on the common layer 530a of the hole transport layer 530 above the G anode electrode 513.

Figure 6C:
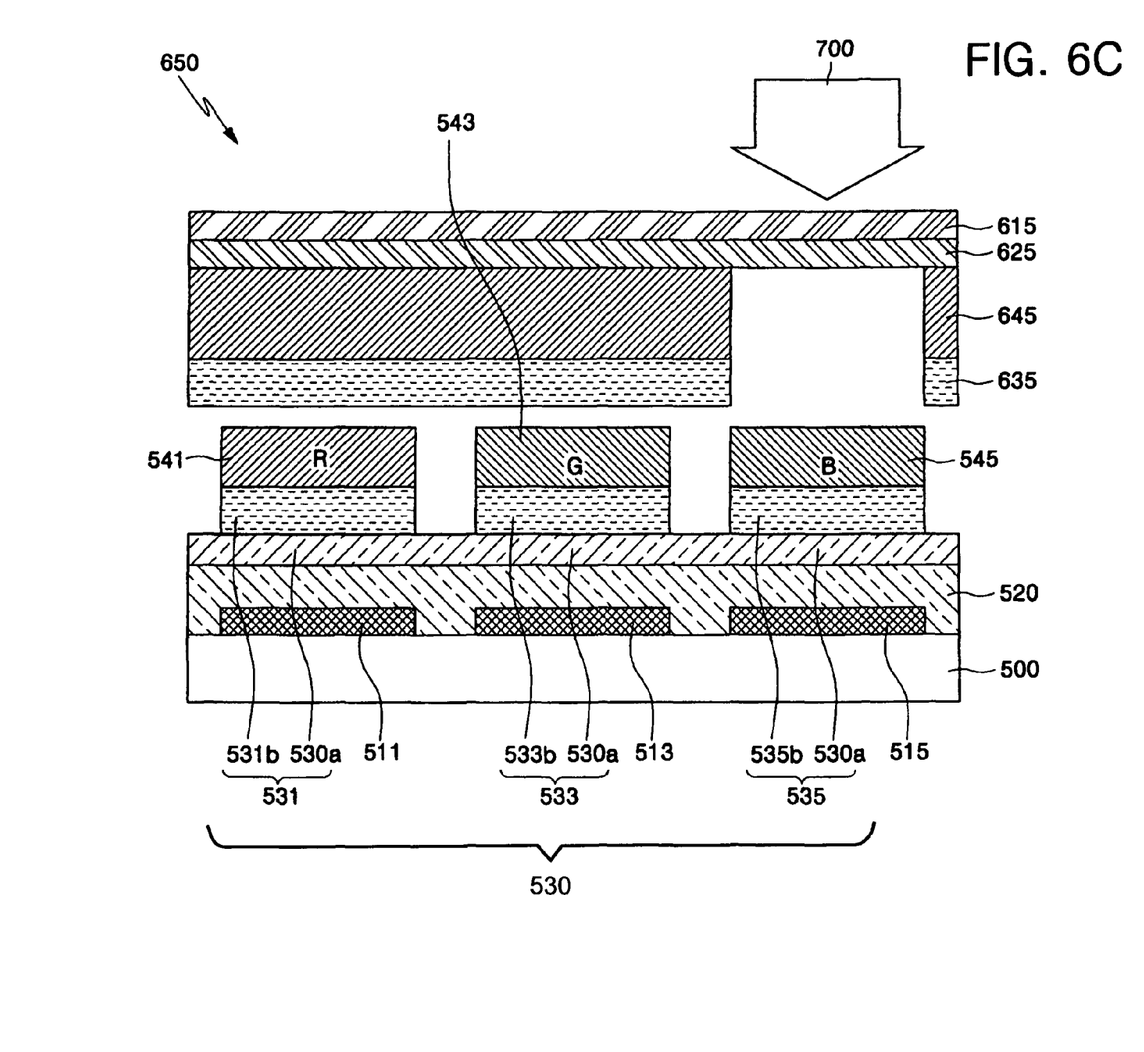

Finally, as shown in FIG. 6C, a thermal transfer device 650 for patterning a patterning layer 535b of the B hole transport layer 535 and a B emission layer 545 is prepared. The thermal transfer device 650 includes a base substrate 615, a light to heat conversion layer 625 formed on the base substrate 615, an organic layer 635 for the B hole transport layer 535 as a transfer layer, and an organic layer 645 for the B emission layer 545.

A laser 700 is irradiated onto the thermal transfer device 650, simultaneously patterning the organic layers 635 and 645 so as to form the patterning layer 535b and the emission layer 545. Therefore, the patterning layer 535b of the B hole transport layer 535 and the emission layer 545 are formed on the common layer 530a above the B anode electrode 515.

While the embodiments of the present invention describe the thermal transfer device as having a structure such that the light to heat conversion layer and the transfer layer are deposited on the base substrate, a layer for improving thermal transfer characteristics (for example, an intermediate layer etc.) may be inserted therebetween. In addition, the thicknesses described in Tables 1 and 2 may be varied depending upon changes in process conditions and device characteristics.

As can be seen from the foregoing, since the charge transport layer and the emission layer are simultaneously patterned using the thermal transfer method, the method of the present invention is capable of improving color coordinates and efficiency characteristics by optimizing the optical thicknesses according to the R, G and B pixels, thereby improving display quality and applying to a high resolution OLED.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating an organic light emitting display, comprising steps of:
    forming first, second and third electrodes, respectively corresponding to R (red), G (green) and B (blue) pixels, on a substrate;
    depositing a hole injection layer over the substrate and the first, second and third electrodes;
    depositing a common hole transport layer over the hole injection layer;
    thermally transferring a first organic layer from a base substrate to the common hole transport layer disposed over the first electrode, the first organic layer including a first hole transport layer and a first emission layer corresponding to each R (red) pixel;
    thermally transferring a second organic layer from the base substrate to the common hole transport layer disposed over the second electrode, the second organic layer including a second hole transport layer and a second emission layer corresponding to each G (green) pixel;
    thermally transferring a third organic layer from the base substrate to the common hole transport layer disposed over the third electrode, the third organic layer including a third emission layer corresponding to each B (blue) pixel;
    forming a hole blocking layer over exposed portions of the common hole transport layer and over each of the first second and third organic layers;
    forming an electron transport layer over the hole blocking layer; and
    forming a common electrode on the electron transport layer.

2. The method of fabricating an organic light emitting display as set forth in claim 1, the third organic layer further including a third hole transport layer.

3. The method of fabricating an organic light emitting display as set forth in claim 2, further comprising:
    a thickness of the hole injection layer and the common hole transport layer being about 1300 Å over the first, second and third electrodes;
    the first hole transport layer having a thickness of about 1050 Å;
    the second hole transport layer having a thickness of about 400 Å;
    the third hole transport layer having a thickness of about 50 Å;
    the first emission layer having a thickness of about 300~400 Å, the second emission layer having a thickness of about 250~350 Å, and the third emission layer having a thickness of about 100~200 Å; and
    a thickness of the hole blocking layer and the electron transport layer being about 350 Å over the first, second and third emission layers.

4. The method of fabricating an organic light emitting display as set forth in claim 2, further comprising:
    a thickness of the hole injection layer and the common hole transport layer being about 100 Å over the first, second and third electrodes;
    the first hole transport layer having a thickness of about 250 Å;
    the second hole transport layer having a thickness of about 250 Å;
    the third hole transport layer having a thickness of about 250 Å;

the first emission layer having a thickness of about 300~400 Å, the second emission layer having a thickness of about 250~350 Å, and the third emission layer having a thickness of about 100~200 Å; and a thickness of the hole blocking layer and the electron transport layer being about 300 Å over the first, second and third emission layers.

5. The method of fabricating an organic light emitting display as set forth in claim 1, further comprising:

a thickness of the hole injection layer and the common hole transport layer being about 1350 Å over the first, second and third electrodes;

the first hole transport layer having a thickness of about 1000 Å;

the second hole transport layer having a thickness of about 350 Å;

the first emission layer having a thickness of about 300~400 Å, the second emission layer having a thickness of about 250~350 Å, and the third emission layer having a thickness of about 100~200 Å; and a thickness of the hole blocking layer and the electron transport layer being about 350 Å over the first, second and third emission layers.

6. A method of fabricating an organic light emitting display (OLED), comprising steps of:

forming a first thermal transfer donor element comprising a first base substrate, a first light-to-heat conversion layer, and a first organic layer;

forming a second thermal transfer donor element comprising a second base substrate, a second light-to-heat conversion layer, and second organic layer;

forming a third thermal transfer donor element comprising a third base substrate, a third light-to-heat conversion layer, and a third organic layer;

forming first, second and third electrodes, respectively corresponding to R (red), G (green) and B (blue) pixels, on an OLED substrate;

depositing a hole injection layer over the OLED substrate and the first, second and third electrodes;

depositing a common hole transport layer over the hole injection layer;

thermally transferring the first organic layer from the first thermal transfer donor element to the common hole transport layer disposed over the first electrode, the first organic layer including a first hole transport layer and a first emission layer corresponding to each R (red) pixel;

thermally transferring the second organic layer from the first thermal transfer donor element to the common hole transport layer disposed over the second electrode, the second organic layer including a second hole transport layer and a second emission layer corresponding to each G (green) pixel;

thermally transferring the third organic layer from the first thermal transfer donor element to the common hole transport layer disposed over the third electrode, the third organic layer including a third emission layer corresponding to each B (blue) pixel;

forming a hole blocking layer over exposed portions of the common hole transport layer and over each of the first second and third organic layers;

forming an electron transport layer over the hole blocking layer; and forming a common electrode on the electron transport layer.

7. The method of fabricating an organic light emitting display (OLED) as set forth in claim 6, the third organic layer further including a third hole transport layer.

8. The method of fabricating an organic light emitting display (OLED) as set forth in claim 7, further comprising:

a thickness of the hole injection layer and the common hole transport layer being about 1300 Å over the first, second and third electrodes;

the first hole transport layer having a thickness of about 1050 Å;

the second hole transport layer having a thickness of about 400 Å;

the third hole transport layer having a thickness of about 50 Å;

the first emission layer having a thickness of about 300~400 Å, the second emission layer having a thickness of about 250~350 Å, and the third emission layer having a thickness of about 100~200 Å;

a thickness of the hole blocking layer and the electron transport layer being about 350 Å over the first, second and third emission layers; and the common electrode being formed of indium tin oxide (ITO) having a thickness of about 125 Å.

9. The method of fabricating an organic light emitting display (OLED) as set forth in claim 7, further comprising:

a thickness of the hole injection layer and the common hole transport layer being about 100 Å over the first, second and third electrodes;

the first hole transport layer having a thickness of about 250 Å;

the second hole transport layer having a thickness of about 250 Å;

the third hole transport layer having a thickness of about 250 Å;

the first emission layer having a thickness of about 300~400 Å, the second emission layer having a thickness of about 250~350 Å, and the third emission layer having a thickness of about 100~200 Å;

a thickness of the hole blocking layer and the electron transport layer being about 300 Å over the first, second and third emission layers; and the common electrode being formed of indium tin oxide (ITO) having a thickness of about 125 Å.

10. The method of fabricating an organic light emitting display (OLED) as set forth in claim 6, further comprising:

a thickness of the hole injection layer and the common hole transport layer being about 1350 Å over the first, second and third electrodes;

the first hole transport layer having a thickness of about 1000 Å;

the second hole transport layer having a thickness of about 350 Å;

the first emission layer having a thickness of about 300~400 Å, the second emission layer having a thickness of about 250~350 Å, and the third emission layer having a thickness of about 100~200 Å;

a thickness of the hole blocking layer and the electron transport layer being about 350 Å over the first, second and third emission layers; and the common electrode being formed of indium tin oxide (ITO) having a thickness of about 125 Å.

* * * * *